United States Patent
Kazama et al.

(10) Patent No.: US 12,258,270 B2
(45) Date of Patent: Mar. 25, 2025

(54) GROUP-III NITRIDE SEMICONDUCTOR NANOPARTICLES, CORE-SHELL-TYPE PARTICLES, AND METHOD FOR MANUFACTURING SAME

(71) Applicant: STANLEY ELECTRIC CO., LTD., Tokyo (JP)

(72) Inventors: Takuya Kazama, Tokyo (JP); Wataru Tamura, Tokyo (JP); Yasuyuki Miyake, Tokyo (JP); Kenji Moriyama, Tokyo (JP); Atsushi Muramatsu, Sendai (JP); Kiyoshi Kanie, Sendai (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/028,594

(22) PCT Filed: Sep. 13, 2021

(86) PCT No.: PCT/JP2021/033494
§ 371 (c)(1),
(2) Date: Mar. 27, 2023

(87) PCT Pub. No.: WO2022/070854
PCT Pub. Date: Apr. 7, 2022

(65) Prior Publication Data
US 2023/0357011 A1    Nov. 9, 2023

(30) Foreign Application Priority Data
Sep. 30, 2020  (JP) .................. 2020-164723

(51) Int. Cl.
C01B 21/072   (2006.01)
H01L 29/20    (2006.01)

(52) U.S. Cl.
CPC ........ C01B 21/072 (2013.01); H01L 29/2003 (2013.01); *C01P 2002/70* (2013.01);
(Continued)

(58) Field of Classification Search
CPC ... C01B 21/072; C01B 21/0632; C01B 21/06; C01B 21/064; H01L 29/2003; C30B 29/40; C09K 11/0883; C09K 11/62
(Continued)

(56) References Cited

U.S. PATENT DOCUMENTS 8,552,417 B2   10/2013  Taylor et al.
11,499,096 B2  11/2022  Moriyama et al.
(Continued)

FOREIGN PATENT DOCUMENTS

JP   2004307679 A   11/2004
JP   2012515803 A    7/2012
(Continued)

OTHER PUBLICATIONS

International Search Report (ISR) (and English translation thereof) dated Nov. 16, 2021, issued in International Application No. PCT/JP2021/033494.
(Continued)

*Primary Examiner* — Tri V Nguyen
(74) *Attorney, Agent, or Firm* — Holtz, Holtz & Volek PC

(57) ABSTRACT

A method for manufacturing Group-III nitride semiconductor nanoparticles includes synthesizing Group-III nitride semiconductor nanoparticles having a particle size of 16 nm or less by reacting materials containing one or more Group-III elements M in a liquid phase, wherein a coordination solvent is used, and trimethyl M is used as at least one Group-III element material among the materials containing one or more Group-III elements M.

6 Claims, 4 Drawing Sheets

(52) U.S. Cl.
CPC ...... *C01P 2004/64* (2013.01); *C01P 2006/40* (2013.01); *C01P 2006/80* (2013.01)

(58) Field of Classification Search
USPC ............................... 252/521.5; 423/351, 409
See application file for complete search history.

(56) References Cited

U.S. PATENT DOCUMENTS

| | | | | |
|---|---|---|---|---|
| 2010/0052512 | A1* | 3/2010 | Clough | C09K 11/02 |
| | | | | 252/512 |
| 2011/0272668 | A1* | 11/2011 | Taylor | C09K 11/025 |
| | | | | 977/774 |
| 2012/0018774 | A1* | 1/2012 | Taylor | C01B 21/06 |
| | | | | 977/773 |
| 2013/0309160 | A1 | 11/2013 | Kahn et al. | |
| 2015/0291423 | A1* | 10/2015 | Grundy | C01B 21/072 |
| | | | | 423/412 |
| 2019/0264104 | A1 | 8/2019 | Ono et al. | |

FOREIGN PATENT DOCUMENTS

| | | | |
|---|---|---|---|
| JP | 2014508086 A | | 4/2014 |
| KR | 20160141258 A | * | 5/2015 |
| KR | 20200101945 A | | 8/2020 |
| WO | 2018092638 A1 | | 5/2018 |

OTHER PUBLICATIONS

Written Opinion dated Nov. 16, 2021, issued in International Application No. PCT/JP2021/033494.
English language International Preliminary Report on Patentability (IPRP) dated Mar. 28, 2023, issued in counterpart International Application No. PCT/JP2021/033494.
Japanese Office Action (and an English language translation thereof) dated Aug. 6, 2024, issued in counterpart Japanese Application No. 2020-164723.
Korean Office Action (Request for the Submission of an Opinion) (and an English language translation thereof) dated Dec. 13, 2024, issued in counterpart Korean Application No. 10-2023-7005391.

* cited by examiner

BAND STRUCTURE
Type1

| (a.u) | | Li | Na | K | P | Mn | Fe | Zn |
|---|---|---|---|---|---|---|---|---|
| In | InI₃ | 0.21 | 0.06 | 0.01 | NOT DETECTED | NOT DETECTED | 0.01 | NOT DETECTED |
| | TMIn | NOT DETECTED | NOT DETECTED | NOT DETECTED | NOT DETECTED | NOT DETECTED | NOT DETECTED | NOT DETECTED |
| Ga | GaI₃ | NOT DETECTED | 0.1 | 0.02 | 0.4 | 0.01 | 0.05 | 0.1 |
| | TMGa | NOT DETECTED | NOT DETECTED | NOT DETECTED | NOT DETECTED | NOT DETECTED | NOT DETECTED | NOT DETECTED |

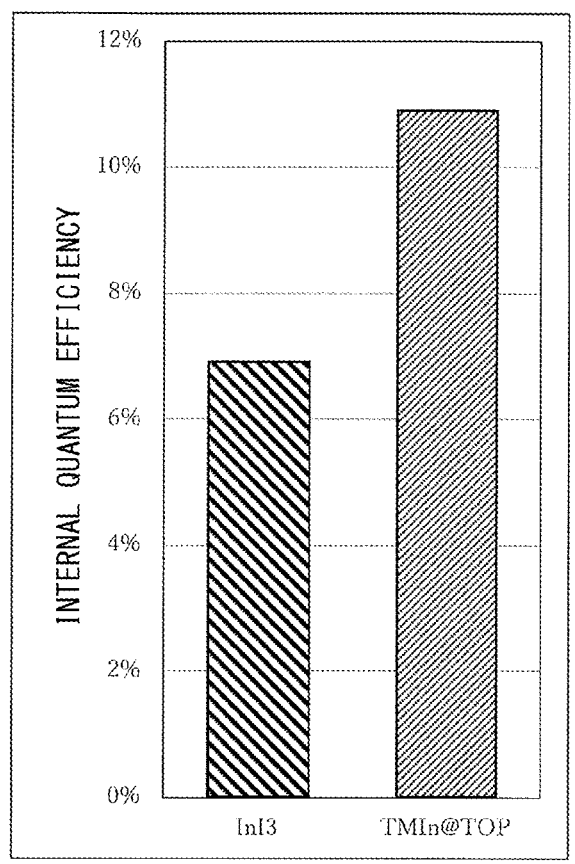

GROUP-III NITRIDE SEMICONDUCTOR NANOPARTICLES, CORE-SHELL-TYPE PARTICLES, AND METHOD FOR MANUFACTURING SAME

TECHNICAL FIELD

The present invention relates to semiconductor nanoparticles made of nitrides of Group-III elements such as Al, Ga, or In, and more particularly, to a method for manufacturing Group-III nitride semiconductor nanoparticles without using a halogen-based material.

BACKGROUND ART

Nitride nanoparticles are materials expected to be applied to EL devices such as an illuminator or a display, light receiving elements such as a sensor or a solar cell, and photocatalysts for hydrogen generation or the like. Nitride nanoparticles are known to exhibit a quantum effect when a particle size is less than or equal to twice a Bohr radius. Even with nitride nanoparticles having the same composition, an energy gap can be controlled by changing the particle size, and controllability of a light emission wavelength and an absorption edge of light is greatly improved.

A Bohr radius of a Group-III nitride represented by $Al_xGa_yIn_zN$ ($0 \le (x, y, z) \le 1$ and $x+y+z=1$) is 2.3 nm for AlN, 3.3 nm for GaN, and 8.2 nm for InN, and a light emission region can be controlled from an ultraviolet region to an infrared region by controlling a composition and a particle size thereof. In particular, by containing In, nitride nanoparticles that emit light in a visible region can be manufactured, and light emission efficiency is improved.

A method for manufacturing Group-III nitride nanoparticles is generally a chemical synthesis method in which a Group-III element material and a nitrogen material are synthesized in a liquid phase, and nanoparticles having a particle size of 16 nm or less that exhibit a quantum effect can be manufactured by the chemical synthesis method. As the Group-III element material, a halogen compound such as indium iodide and gallium iodide, which can maintain stability even during heating at the time of chemical synthesis, is used. For example, PTL 1 describes a method for manufacturing nitride nanoparticles by using indium iodide and gallium iodide.

CITATION LIST

Patent Literature

PTL 1: JP2012-515803A

SUMMARY OF INVENTION

Technical Problem

However, when a halogen compound is used as a synthetic raw material, there is a problem that a trace amount of halogen is incorporated as impurities into particles in the generated nitride. Further, in a halogen-based material, a transition element such as an iron group or an alkali metal element such as Li and Na remains as a residue in a material manufacturing process, and these elements are also incorporated into the nitride particles as impurities in the same manner as halogen. The impurities incorporated into the particles function as a non-light emitting center with respect to excited carriers, resulting in a decrease in light emission efficiency. In particular, the transition element such as an iron group or the alkali metal element such as Li and Na causes a fatal decrease in light emission efficiency even in a trace amount of a few ppm order.

Group-III compounds other than the halogen compound include organic Group-III compounds such as trimethylindium (hereinafter referred to as TMIn) and triethylindium. Since these compounds do not contain an unnecessary element with a high purity in the material itself, there is an example in which these compounds are used as materials for vapor phase growth such as MOCVD in manufacturing a high-quality nitride thin film such as an LED. However, when TMIn is heated to 80° C. or higher, there is a risk of causing an intense self-decomposition reaction with explosion. Therefore, TMIn cannot be used in chemical synthesis in which TMIn is directly heated, reacted, and decomposed. In particular, since high thermal energy is required in the chemical synthesis of the nitride nanoparticles, it is necessary to react and decompose the material at least at 100° C. or higher, and preferably 150° C. or higher, and TMIn cannot be used as the material. In addition, since an In metal is precipitated when a self-decomposition reaction occurs, nitride nanoparticles containing In cannot be produced or a nitride having an intended element ratio cannot be obtained.

The invention is made to solve the above problems in the related art, and an object of the invention is to provide a method for manufacturing Group-III nitride nanoparticles by chemical synthesis without using a halogen material, to thereby provide Group-III nitride nanoparticles containing no halogen.

Solution to Problem

In order to solve the above problems, as a result of intensive research on conditions for a reaction with an organic Group-III material that can be used for chemical synthesis, it is found that Group-III nitride nanoparticles that have limited self-decomposition, a desired composition, and a particle size of 16 nm or less can be manufactured by using trimethyl M (M is one or more of Al, Ga, and In) as a Group-III element material and reacting trimethyl M in a coordination solvent. The manufactured Group-III nitride nanoparticles do not contain impurity elements contained in a halogen element or a halogen-based material, and have quantum efficiency higher than that of Group-III nitride nanoparticles synthesized by using a halogen-based material.

Advantageous Effects of Invention

According to the invention, in the chemical synthesis of the nitride nanoparticles, an explosive self-decomposition reaction of TMIn can be limited, and nitride nanoparticles can be stably manufactured. In addition, according to the invention, nitride nanoparticles substantially containing no impurities that inhibit light emission efficiency and having high light emission efficiency can be provided.

BRIEF DESCRIPTION OF DRAWINGS

FIG. 5 is a diagram illustrating a result of quantum efficiency measurement of the nitride nanoparticles obtained in Example 1 and Comparative Example 3.

DESCRIPTION OF EMBODIMENTS

Hereinafter, an embodiment of Group-III nitride nanoparticles and a method for manufacturing the same according to the invention will be described.

The Group-III nitride nanoparticles according to the invention are nanoparticles represented by a General Formula: $Al_xGa_yIn_zN$ (where $0 \leq (x, y, z) \leq 1$ and $x+y+z=1$), or a General Formula: $Al_xGa_yIn_zN$ (where $0 \leq (x, y) < 1$, $0 < z \leq 1$, and $x+y+z=1$). Parentheses in "$0 \leq (x, y, z) \leq 1$" or the like means that each of x, y, and z is in a relationship represented by an inequality sign or an equal sign therebefore and thereafter.

The Group-III nitride nanoparticles according to the invention also include core-shell-type particles in which the nanoparticles represented by the above General Formula are used as core particles and the Group-III nitride represented by the General Formula is used as a shell.

Figure 1:
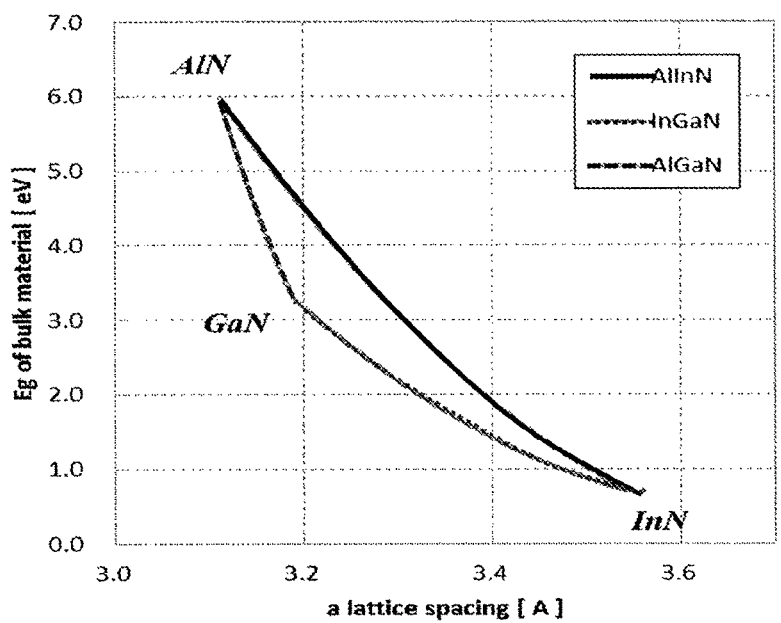
FIG. 1 is a diagram illustrating a relationship between a composition and an energy gap of Group-III nitride nanoparticles.
Figures 2, 3:
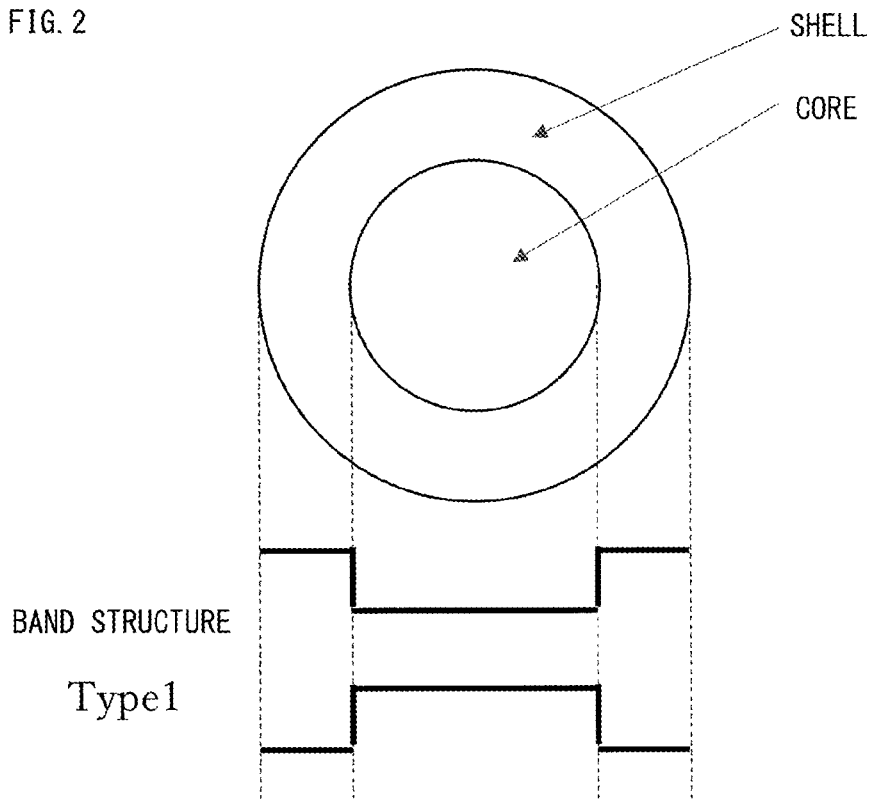
FIG. 2 is a diagram illustrating a structure of core-shell-type nanoparticles and an energy gap.
FIG. 3 is a table illustrating a result of ICP analysis of Group-III materials for manufacturing the Group-III nitride nanoparticles.

As illustrated in FIG. 1, energy gaps of nitrides of aluminum (Al), gallium (Ga), and indium (In) are within a range of a region obtained by connecting energy gaps of unary nitrides (AlN, GaN, InN) using curves illustrating energy gaps of binary nitrides, and can be freely changed within this range by changing a ratio of these three elements. In addition, the core-shell-type has a Type 1 band structure as illustrated in FIG. 2, in which a ratio of elements constituting the core particles and the shell is determined such that an energy gap (EG core) of the core particles and an energy gap (EG shell) of the shell satisfy EG core<EG shell. As illustrated in FIG. 1, the larger the amount of Al, the higher the energy gap, and the larger the amount of In, the lower the energy gap. Therefore, for example, the Type 1 band structure can be obtained by a combination of core particles containing a relatively large amount of In and a shell containing a relatively large amount of Al. An example includes core-shell-type particles in which the core particles are InGaN and the shell is AlInN. The invention is not limited to this example, and various compositional combinations are possible if the energy gaps of the core particles and the shell satisfy the above relationship. In particular, Group-III nitride nanoparticles containing indium or core-shell particles containing the Group-III nitride nanoparticles as core particles are preferred, whereby a light emission range can be extended to a visible region and light emission efficiency is also improved.

A ratio of a Group-III element in the nitride can be adjusted by using a compound, which is a raw material of the Group-III element, in a stoichiometric ratio such that a molar ratio of the Group-III element is a desired ratio in manufacturing the Group-III nitride nanoparticles described later. In the manufacturing method according to the invention, since precipitation of metals and mixing of impurities are limited during a reaction, a desired ratio can be obtained.

The nitride nanoparticles according to the invention have a particle size of 16 nm or less. The particle size of 16 nm or less is equal to or less than twice a Bohr radius of InN (8.2 nm), thereby exhibiting a quantum effect and achieving high light emission efficiency. The nitride nanoparticles can generally have a particle size of 16 nm or less by chemical synthesis under a high temperature condition in an appropriate solvent, and in the manufacturing method according to the invention, the particle size can be obtained by adjusting synthesis conditions such as a synthesis temperature, a heating time, a solvent, and a material concentration during manufacturing. Specific synthesis conditions will be described later.

Further, the nitride nanoparticles according to the invention is characterized in that the nanoparticles do not substantially contain halogen elements and impurity elements mixed into a halogen compound. Nitride nanoparticles manufactured by a chemical synthesis method in the related art are manufactured by using a halogen compound as a Group-III element material at the time of synthesis, and impurities derived from the halogen compound are inevitably mixed. The impurities derived from the halogen compound vary depending on the type of the halogen compound, and examples thereof include halogen elements such as iodine (I) and bromine (Br), transition elements such as fluorine, iron, manganese, and zinc, and alkali metal elements such as Li and Na. Since the nitride nanoparticles according to the invention are manufactured by chemical synthesis without using a halogen compound, such impurities are not mixed, and high quantum efficiency (light emission efficiency) is exhibited.

The Group-III nitride nanoparticles/core-shell-type Group-III nitride nanoparticles according to the invention can be widely used for general applications of semiconductor nanoparticles and, in particular, can be suitably used in wavelength conversion materials, photocatalysts, solar cells, EL light emitting devices and the like, by utilizing the high quantum efficiency (high energy conversion efficiency, light emission efficiency, light absorption efficiency, and the like derived therefrom).

Next, the method for manufacturing the above-described Group-III nitride nanoparticles will be described.

In the method for manufacturing the Group-III nitride nanoparticles according to the invention, when materials containing one or more Group-III elements M are reacted in a liquid phase to synthesize the Group-III nitride semiconductor nanoparticles having a particle size of 16 nm or less, trimethyl M is used as at least one Group-III material among the materials containing one or more Group-III elements M. Trimethyl M is pretreated by using a coordination solvent.

The manufactured Group-III nitride semiconductor nanoparticles are nanoparticles represented by a General Formula: $Al_xGa_yIn_zN$ (where $0 \leq (x, y, z) \leq 1$, and $x+y+z=1$), or nanoparticles represented by a General Formula: $Al_xGa_yIn_zN$ (where $0 \leq (x, y) < 1$, $0 < z \leq 1$, and $x+y+z=1$).

Hereinafter, the method for manufacturing the Group-III nitride nanoparticles according to the invention will be described in detail.

The method for manufacturing the Group-III nitride nanoparticles according to the invention is based on a chemical synthesis method of charging a Group-III material and a nitrogen material into a solvent and heating to synthesize a nitride.

A compound of Al, Ga, and In is used as the Group-III material, and when y>0 in the above-described General Formula, that is, In is contained, trimethylindium (TMIn) is used at least as a material of In. Examples of an organic In compound include, in addition to TMIn, trialkylindium having a long organic chain such as triethylindium having a similar structure, and these In compounds cause a β dehydrogenation reaction during a reaction at a high temperature to generate a metal hydride, and to further generate a metal as a by-product of hydrogen reduction caused by the metal hydride. As a result, a stoichiometric ratio of a Group-V element to a Group-III element in the obtained nitride nanoparticles changes, and a nitride having a desired composition cannot be obtained. Since such a dehydrogenation reaction is less likely to occur when TMIn is used, nitride nanoparticles having a stable composition can be obtained without precipitation of metal indium.

Before the reaction, TMIn is preferably treated with a coordination solvent to form a precursor. The coordination solvent is coordinated to In of TMIn, thereby limiting an intense self-decomposition reaction. As the coordination solvent, trioctylphosphine (boiling point: 351° C.), tributylphosphine (boiling point: 150° C. under a condition of 6.7 kPa), trioctylamine (boiling point: 367° C.), diphenyl ether (boiling point: 260° C.), or the like can be used, and trioctylphosphine (hereinafter abbreviated as TOP) is particularly preferred.

Trimethylaluminum (TMAl) and trimethylgallium (TMGa) are preferably used as materials of Al and Ga, and compounds other than trimethylated metals (excluding halogen compounds) may be used. For example, aluminum acetonate or the like can be used for Al, and gallium acetonate can be used for Ga. However, in order to reduce an amount of the impurity elements mixed into the nitride as much as possible and maintain the chemical quantity ratio (stoichiometric ratio), it is most preferable to use trimethylaluminum and trimethylgallium as in the In material.

As the nitrogen material, ammonia, a metal azide compound, a metal nitride, hydrazines, amines, a metal amide, or the like can be used. In particular, a metal amide such as sodium amide and lithium amide is preferred.

As the reaction solvent, a general solvent used for synthesis of a nitride can be used. Specific examples thereof include tetradecylbenzene (boiling point: 356° C.), 1-octadecene (boiling point: 320° C.), TOP, tributylphosphine, trioctylphosphine oxide (boiling point: 238° C. under a condition of 0.4 kPa), and diphenyl ether, and tetradecylbenzene is particularly preferred.

In the manufacturing method according to the invention, first, TMIn among the Group-III materials is dissolved in a coordination solvent to form a precursor. The precursor is in a state of being isolated when TMIn is solvated, and the self-decomposition reaction is limited by making the precursor into such a state. The precursor formation treatment is performed at 20° C. to a boiling point of the solvent or less, preferably at 80° C. or lower since there is an explosion risk due to the self-decomposition reaction at 88° C. (melting point of TMIn) or higher. For example, when TOP is used, it is considered that the precursor has a structure in which P (phosphorus) of TOP is coordinately bonded to a metal (indium) to which a trimethyl group is bonded, and since TMIn molecules are isolated by coordinating a bulky trioctyl group, a high self-decomposition reaction is inhibited, and a relatively determined (stable) state can be maintained for a long time. Accordingly, TOP continuously functions as a stable Group-III supply source even under heating at 100° C. or higher.

For an amount of the coordination solvent required for the precursor formation, a molar ratio of P contained in TOP to a metal element of the trimethylated metal charged as the Group-III material is preferably 1:1 or more, and more preferably 3:1 or more.

After such a precursor formation treatment is performed, a Group-III element material other than TMIn, a nitrogen material, and a reaction solvent are added to the reaction system, and the synthesis reaction is advanced. Although a concentration of the material is not particularly limited, a concentration of the metal element (stoichiometrically obtained total amount) in the reaction solvent is preferably about 3 to 36 mol/liter. In addition, the amount of the nitrogen material is preferably equal to or more than the amount of the Group-III element material, and the concentration in the reaction solvent is preferably about 27 to 720 mol/liter.

The reaction is performed under an inert atmosphere while heating at 200° C. or higher, preferably 300° C. or higher, and more preferably 330° C. or higher. By reacting at such a temperature, nitride nanoparticles having a particle size of 16 nm or less are generated. A reaction time is about 1 to 5 minutes depending on a scale of the reaction. After the reaction, the particles are washed by repeating centrifugation using a predetermined solvent, and recovered as particles or as a solvent dispersion.

A method for manufacturing the core-shell-type nanoparticles is the same as a method for manufacturing general core-shell-type nanoparticles, the Group-III nitride nanoparticles obtained by the above-described manufacturing method is used as core particles, and a Group-III nitride serving as a shell covering the core particles is synthesized. The compositions of the core particles and the shell are selected such that the energy gap (EG core) of the core particles and the energy gap (EG shell) of the shell satisfy EG core<EG shell in order to obtain the Type 1 structure. For example, the core particles have a composition containing a relatively large amount of In, and the shell has a composition containing a relatively large amount of Al. In addition, as a material of a Group-III element constituting the shell, a material other than the halogen compound, in particular, a trimethylated product is used.

In the synthesis reaction for forming the shell, the nanoparticles manufactured by the above-described manufacturing method, the material of the Group-III element constituting the shell, and a solvent are added to a reaction container, and heated under an inert atmosphere to 200° C. or higher, preferably 300° C. or higher, and more preferably 330° C. or higher. As the solvent, a solvent same as the solvent used to manufacture the core particles can be used. A method for recovering the generated core-shell particles is the same as the method for recovering the core particles, and the core-shell particles are recovered as a dispersion liquid by repeating centrifugation using a dispersion medium and washing.

Since the Group-III nitride nanoparticles/core-shell-type Group-III nitride nanoparticles obtained by the above manufacturing method do not contain a halogen-based material containing impurity elements such as iron, the nanoparticles do not substantially contain impurities (for example, not detected by powder X-ray measurement), have a high purity, and have no decrease in light emission efficiency due to the impurities.

EXAMPLES

Hereinafter, an example of manufacturing Group-III nitride nanoparticles according to the invention will be described. In the following Examples and Comparative Examples, a particle size was measured by a transmission electron microscope (TEM)/scanning transmission electron microscope (STEM).

Example 1

Trimethylgallium (TMGa) was used as a Ga source, TMIn was used as an In source, and lithium amide was used as a Group-V source. A result of general ICP measurement of TMGa and TMIn used as materials is illustrated in FIG. 3. For reference, measurement results of indium iodide and gallium iodide are also illustrated in FIG. 3. As illustrated, a transition metal or an alkali metal was detected in the iodide, whereas such impurity elements were not detected in the materials used in the present example.

First, TMIn (0.0675 mmol) was added to TOP (0.5 ml), and the mixture was heated to 40° C. to perform a precursor formation treatment. In the following, TMIn after the precursor formation treatment is abbreviated as TMIn@TOP.

To a glass reaction container, 0.0675 mmol of TOP@TMIn in terms of TMIn amount, 0.0675 mmol of TMGa, and 2.7 mmol of lithium amide were added, tetradecylbenzene (1.0 ml) was added as a reaction solvent, and the mixture was heated under an inert atmosphere to 350° C. and reacted for about 3 minutes.

After the reaction, the product was recovered in a centrifuge tube, a mixed solvent obtained by mixing hexane and ethanol at a volume ratio of about 3:7 was added, the mixture was centrifuged at 10,000 to 30,000 rpm for about 30 minutes, and the supernatant was discarded. The obtained precipitate was dispersed in hexane, ethanol was added, and the mixture was centrifuged again under the same conditions. This step was repeated 3 to 5 times to wash the particles. Finally, the product was dispersed with hexane to obtain a sample of a hexane dispersion. The particle size of the obtained nanoparticles was 3 nm to 5 nm.

Comparative Example 1

When TMIn without being subjected to a precursor formation treatment was used as an In source instead of TMIn@TOP, explosive self-decomposition occurred during heating, and the product could not be recovered.

Comparative Example 2

Nitride particles were manufactured by a reaction in the same manner as in Example 1 except that triethylindium (TEIn) was used as an In source instead of TMIn. TEIn did not cause a self-decomposition reaction, and was thus directly added to a reaction solvent without being subjected to a precursor formation treatment. A particle size of the obtained nanoparticles was 50 nm to 200 nm.

Comparative Example 3

Nitride nanoparticles (hexane-dispersed) were obtained in the same manner as in Example 1 except that indium iodide ($InI_3$) and gallium iodide ($GaI_3$) were used as an In source and a Ga source instead of TMIn and TMGa. The particle size of the obtained nanoparticles was 3 nm to 5 nm.

The nitride particles obtained in Example 1 and Comparative Examples 2 and 3 were subjected to powder X-ray diffraction measurement (XRD). A result is illustrated in FIG. 4.

Figure 4:
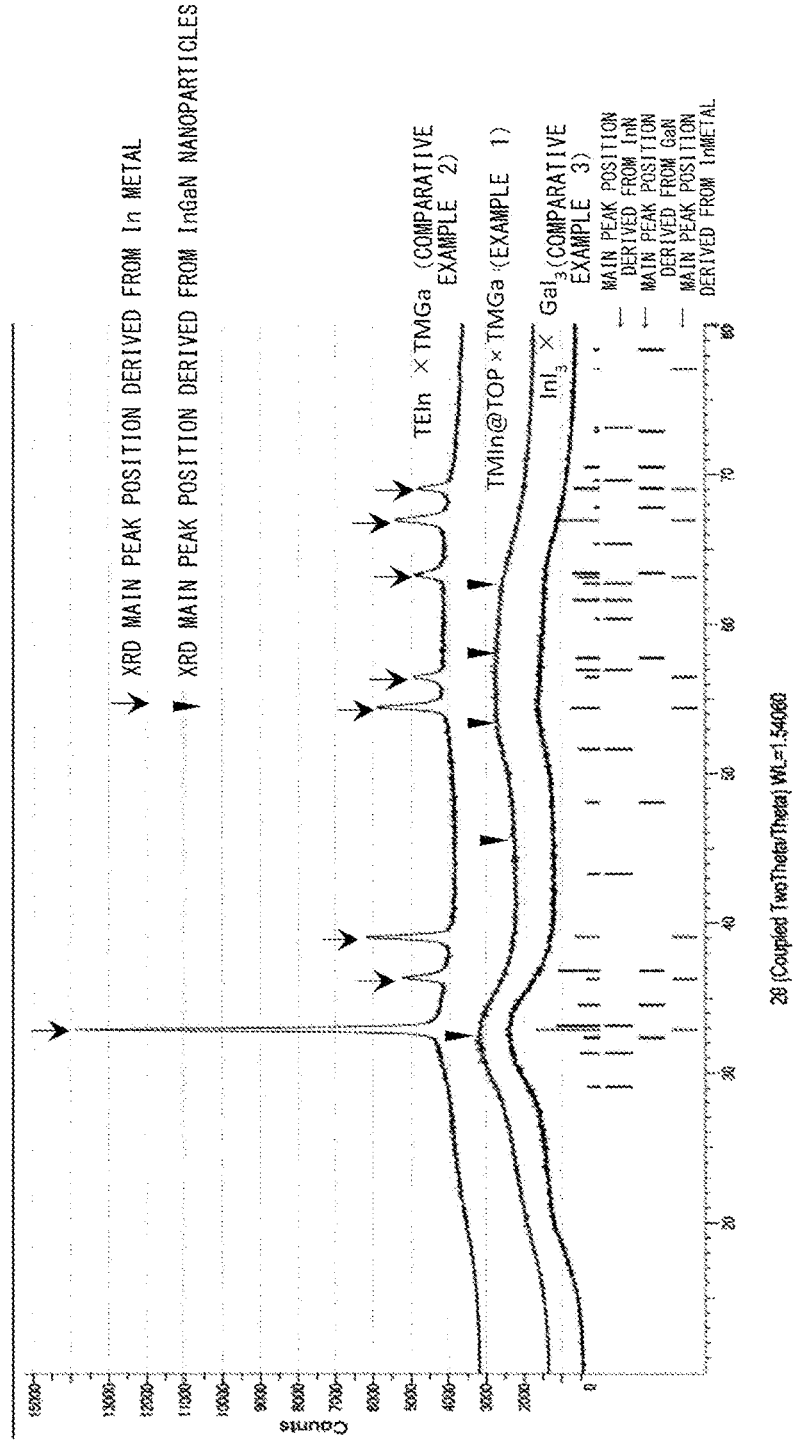
FIG. 4 is a diagram illustrating a result of X-ray diffraction analysis of nitride nanoparticles obtained in Example 1 and Comparative Examples 2 and 3.

From the result of the powder X-ray measurement illustrated in FIG. 4, it was confirmed that the nitride nanoparticles were generated in each of Example 1 and Comparative Examples 2 and 3, and it was confirmed that an In metal was precipitated in Comparative Example 2. From this, it was found that when an alkyl chain became long, metal precipitation by a reduction reaction occurred, nitride particles having a good purity were not obtained, and a yield was also lowered.

The nitride nanoparticles in Example 1 and Comparative Example 3 were subjected to impurity analysis and quantum efficiency measurement. In the impurity analysis, X-ray fluorescence spectroscopy (XRF) was performed on iron (Fe) and X-ray photoelectron spectroscopy (XPS) and ICP were performed on iodine (I). The quantum efficiency measurement was performed by using a quantum efficiency measuring instrument (QE-2100, OTSUKA ELECTRONICS CO., LTD) and irradiating the particle dispersion liquid with excitation light (365 nm). A result of the impurity analysis is illustrated in Table 1, and a result of the quantum efficiency measurement is illustrated in FIG. 5. The result of the impurity analysis is calculated as "impurity amount (ppm) with respect to Group-III" by using measurement values of the impurities and the Group-III detected in each measurement.

TABLE 1

|  | Fe (XRF) | I (XPS) | I (ICP) |
| --- | --- | --- | --- |
| Example 1 | Not detected (*1) | Not detected (*2) | Not detected (*3) |
| Comparative Example 3 | 83 | 1014 | 876 |

(*1): Detection lower limit: 20 ppm,
(*2): detection lower limit: 500 ppm,
(*3): detection lower limit: 100 ppm As illustrated in Table 1, in Comparative Example 3 in which a halogen compound was used as a Group-III source material, Fe was detected as an impurity in addition to a halogen element (I), whereas in Example 1, these impurity elements were not detected. From this, it is found that an impurity such as Fe other than halogen is an impurity derived from the material, and nitride particles having a high purity can be obtained by not using a halogen compound as a material. As illustrated in FIG. 5, the quantum efficiency of the nitride nanoparticles in Example 1 was about 11%, whereas the quantum efficiency of the nitride nanoparticles in Comparative Example 3 was as low as about 7%, and it was confirmed that light emission efficiency was decreased due to the impurities in the material.

Example 2

The following precursor formation treatment, core particle synthesis, and shell formation were sequentially performed to manufacture core-shell-type nitride particles. Trimethylgallium (TMGa) was used as a Ga source, TMIn was used as an In source, TMAl was used as an Al source, and lithium amide was used as a Group-V source.

In the precursor formation treatment, TMIn@TOP was obtained in the same manner as in Example 1 by adding TMIn to TOP (0.5 ml), and heating the mixture to 40° C. to perform the precursor formation treatment.

In the core particle synthesis, 0.0675 mmol of TMIn@TOP in terms of TMIn amount, 0.0675 mmol of TMGa, 2.7 mmol of lithium amide, and 1.0 ml of tetradecylbenzene as a reaction solvent were added to a glass reaction container, and the mixture was heated under an inert atmosphere to 350° C. and reacted for about 3 minutes.

The product was recovered in a centrifuge tube, subjected to repeated centrifugation and washing with hexane/ethanol in the same manner as in Example 1, and then, hexane-dispersed InGaN nanoparticles (particle size: 3 nm to 5 nm) were obtained.

Next, tetradecylbenzene was added and diffused to an InGaN nanoparticle dispersion liquid and a pressure thereof was reduced, and solvent substitution was performed. InGaN nanoparticles (core particles) after the solvent substitution were added to a glass reaction container, and 0.054 mmol of TMAl and 0.081 mmol of TMIn@TOP were added. In the added materials, a ratio of In in the Group-III elements is 60 atomic %. Further, 2.7 mmol of lithium amide was added thereto, and the mixture was heated under an inert atmosphere to 350° C. to react the materials.

The product was subjected to repeated centrifugation and washing in the same manner as in the above core particle synthesis, and hexane-dispersed core-shell particles ($In_{0.5}Ga_{0.5}N/Al_{0.4}In_{0.6}N$) were finally obtained. It was confirmed by powder X-ray measurement that the obtained particles were nitride nanoparticles. A particle size of the core-shell particles was 3 nm to 6 nm.

Comparative Example 4

Core-shell particles were manufactured in the same manner as in Example 2 except that the In source, the Ga source, and the Al source were changed to indium iodide, gallium iodide, and aluminum iodide ($AlI_3$), respectively. From the result of ICP analysis and the result of quantum efficiency measurement in Comparative Example 3 illustrated in Table 1, it is presumed that the light emission efficiency in Comparative Example 4 is also lower than that in Example 2.

INDUSTRIAL APPLICABILITY

According to the invention, it is possible to provide nitride nanoparticles that can improve performance of wavelength conversion materials, photocatalysts, solar cells, EL light emitting devices, or the like when used in the above applications.

The invention claimed is:

1. A method for manufacturing Group-III nitride semiconductor nanoparticles having a particle size of 16 nm or less, the method comprising:
    forming a precursor by treating trimethylindium with a coordination solvent; and
    after forming the precursor, synthesizing h Group-III nitride semiconductor nanoparticles having the particle size of 16 nm or less, the synthesizing comprising reacting one or more Group-III elements, including the precursor, with a metal amide as a nitrogen material, at a temperature of 100° C. or higher in a liquid phase wherein, in the synthesizing, the one or more Group-III elements further include at least one of trimethylgallium and trimethylaluminum.

2. The method for manufacturing Group-III nitride semiconductor nanoparticles according to claim 1, wherein the Group-III nitride semiconductor nanoparticles are nanoparticles represented by a General Formula: $Al_xGa_yIn_zN$ (where $0\leq(x, y)\leq 1$, $0<z\leq 1$, and $x+y+z=1$).

3. The method for manufacturing Group-III nitride semiconductor nanoparticles according to claim 1, wherein the synthesizing is performed at a temperature in a range of 100° C. to 350° C.

4. The method for manufacturing Group-III nitride semiconductor nanoparticles according to claim 1, wherein forming a precursor is performed at a temperature in a range of 20° C. to 80° C.

5. The method for manufacturing Group-III nitride semiconductor nanoparticles according to claim 4, wherein the synthesizing comprises reacting a mixture of the precursor, trimethylgallium, and the metal amide.

6. The method for manufacturing Group-III nitride semiconductor nanoparticles according to claim 5, wherein the synthesizing produces InGaN nanoparticles, and the method further comprises synthesizing core-shell nanoparticles with InGaN cores by reacting a mixture of the InGaN nanoparticles, the precursor, trimethylaluminum, and a nitrogen source.

* * * * *